United States Patent [19]

Bradley

[11] Patent Number: 5,043,991
[45] Date of Patent: Aug. 27, 1991

[54] DEVICE FOR COMPENSATING FOR THERMAL INSTABILITIES OF LASER DIODES

[75] Inventor: Eric M. Bradley, San Diego, Calif.

[73] Assignee: General Dynamics Corp. Electronics Division, San Diego, Calif.

[21] Appl. No.: 458,155

[22] Filed: Dec. 28, 1989

[51] Int. Cl.$^5$ ............................................... H01S 3/13
[52] U.S. Cl. ...................................... 372/32; 372/33; 372/96; 385/130; 385/141
[58] Field of Search ...................... 372/25, 32, 33, 96, 372/40, 43, 44; 350/96.11–96.13

[56] References Cited

U.S. PATENT DOCUMENTS

| | | | |
|---|---|---|---|
| 3,891,302 | 6/1975 | Dabby et al. | 350/96 |
| 4,464,762 | 8/1984 | Furuya | 372/50 |
| 4,651,322 | 3/1987 | Shimitzu et al. | 372/45 |
| 4,669,086 | 5/1987 | Kaede et al. | 372/32 |
| 4,731,795 | 3/1988 | Clark et al. | 372/71 |
| 4,803,692 | 2/1989 | Sakano et al. | 372/96 |
| 4,914,667 | 4/1990 | Blonder et al. | 372/96 |

OTHER PUBLICATIONS

S. A. Gurevich, et al., *Testing of a Bragg Heterojunction Injection Laser with a Thermally Stable Output Wavelength*, Sov. Tech. Phys. Lett. 11(5), 5/85.

Zh.I. Alferov et al., *Monolithically-Integrated Hybrid Heterostructure Diode Laser with Dielectric-Film Waveguide DBR*, IEEE Journal of Quantum Electronics, vol. QE-23, No. 6, Jun. 1987.

J. M. Hammer et al., *Single Wavelength Operation of the Hybrid-External Bragg-Reflector-Waveguide Laser Under Dynamic Conditions*, Appl. Phys. Lett. 47, No. 3, pp. 183, Aug. 1, 1985.

*Primary Examiner*—Frank Gonzalez
*Assistant Examiner*—Susan S. Morse
*Attorney, Agent, or Firm*—Brown, Martin, Haller & McClain

[57] ABSTRACT

The present invention proposes a dielectric waveguide formed on a substrate of ultra-low thermal expansion glass which is assembled with a commercially available diode laser to create a temperature stabilized laser. The waveguide comprises multiple dielectric films which have equal and opposite temperature induced changes in refractive index with respect to each other into which is formed a Bragg grating, the grooves of which are sufficiently shallow to allow penetration of light into the waveguide of 1 mm to 1 cm. This provides a signal which is both narrowband and frequency stable so that the optical signal can be guaranteed to remain in a given narrow frequency band. The dielectric layers are deposited using ion assisted deposition (IAD) to provide uniform, high density films with reduced index-temperature coefficients and increased density, resulting in a waveguide with near-zero temperature variations in refractive index. After fabrication, the waveguide is assembled to the diode laser, creating a temperature stabilized laser which operates within 1 Å of the target wavelength over the temperature range from 20° C. to 70° C. In one embodiment a temperature stabilized laser is used to pump a Nd:YAG laser providing a stable, high power optical signal.

27 Claims, 1 Drawing Sheet

DEVICE FOR COMPENSATING FOR THERMAL INSTABILITIES OF LASER DIODES

FIELD OF THE INVENTION

The present invention relates to semiconductor diode lasers. More particularly, it relates to a device for temperature stabilization of the wavelength of a diode laser.

BACKGROUND OF THE INVENTION

In order to handle increasing demands for high data rate communications, fiberoptic databus systems require the ability to multiplex wavelengths. The range within which wavelengths can be multiplexed is limited by the luminescence spectrum of semiconductor diode lasers, which 17 has a useful band of only 200 to 300 Å. In order to propagate the greatest number of signals within this narrow spectrum, the wavelengths must be very stable and tightly controlled.

Another aspect of optical communications systems is the free-space optical link. Free-space optical links require a level of source power greater than that achieved with a single diode laser. One solution has been to use a diode laser to pump a Nd:YAG laser which amplifies the diode laser output. The most efficient pumping band for Nd:YAG lasers is at the wavelength of 0.81 m, which is easily achieved with diode lasers. Excessive wavelength shifts, however, can reduce pump absorption efficiency of the Nd:YAG laser. The patent of Clark et al. (U.S. Pat. No. 4,731,795) used a diode laser to pump the Nd:YAG laser, but did not achieve the desired efficiency because the diode did not have a stabilized wavelength. One solution is to temperature stabilize the diode laser used for pumping.

The best wavelength stabilized diode lasers available today are the distributed feedback laser (DFB) and the distributed Bragg reflector laser (DBR). In these lasers, rather than using end mirrors, light is reflected from corrugated waveguides (Bragg gratings) back into the laser active area.

Early DFB and DBR lasers used waveguides which were formed from the same material as the active region. Since the material of the active region was chosen to optimize gain properties, not grating properties, some of the grating characteristics were compromised, including temperature stability (due to changes in refractive index).

The patent of Blonder et al. (U.S. Pat. No. 4,914,667) addresses various issues surrounding mode stabilization of hybrid DBR gratings. A particular longitudinal mode of the laser is selected and the operating point is stabilized at that mode. This requires a thermoelectric cooler or other active cooling technique to avoid undesired drifts and mode instabilities. Very narrow line widths can be achieved by this approach (less than 1 Mhz) and this allows pursuit of applications such as coherent optical communications (optical FM, optical heterodyne, etc.). Much of the work of Blonder et al. is oriented toward this narrow line width arena. Increased performance is achieved at the expense of greater environmental sensitivity and greater cost/complexity.

The range of operating temperatures over which diode lasers normally operated is about 20° C. to 70° C. The variation in wavelength is about 5 Å/° C. for laser diodes with conventional cavities, and about 1 Å/° C. for DFB or DBR lasers. Therefore, the wavelength will drift about 50 Å over the required temperature range for even the best stabilized lasers.

Lasers which use dielectric materials for the corrugated waveguide provided some improvement, but dielectrics are not immune to temperature induced changes. A device described by Furuya (U.S. Pat. No. 4,464,762) utilizes $SiO_2$ as the waveguide layer in which the grating is fabricated and achieves about 10 times less wavelength variation with temperature than previous DBR lasers having the Bragg grating in a III-V compound waveguide. However, temperature induced changes in expansion of the layers of dissimilar materials, and the different charges in refractive index with temperature still result in some thermal instability.

In the patent of Sakano et al. (U.S. Pat. No. 4,803,692) narrow line width was achieved by electrically adjusting the length of the external resonator, but no attempt at temperature stabilization was made. These workers achieved temperature stability about two times better than Furuya.

The variation of $\lambda_{lase}$ with temperature is caused primarily by the change of $n_{eff}$ with temperature. The effective refractive index of the waveguide, $n_{eff}$, is a complex function of the waveguide and cladding layer indices and thicknesses, as described below. (See, for example, Chapter 1 of "Theory of Dielectric Optical Waveguides", D. Marcuse, Academic Press, San Francisco, 1974.)

The electric field of the wave (or "mode") in the waveguide achieves its maximum in the waveguide layer which has a higher refractive index (or dielectric constant) than the cladding layers. However, the exponentially decreasing tails of the mode extend out of the waveguide into the cladding layers. If most of the field strength propagates within the waveguide layer, the effective refractive index of the mode, $n_{eff}$, will reflect the properties of the material which constitutes the waveguide layer. However, if a significant amount of the mode's power propagates in the cladding layers, the mode will tend to reflect the properties of the cladding material. If the field amplitude of the mode is given by E(X) where X is distance in the upward direction from the lower cladding layer toward the upper cladding layer, the change in $n_{eff}$ with temperature is given by:

$$\frac{\Delta n_{eff}}{\Delta T} = \int_d^a E(x)E^*(x)\left[\frac{\Delta n_{SiO_2}}{\Delta T}\right]dx + \int_a^b E(x)E^*(x)\left[\frac{\Delta n_{Ta_2O_5}}{\Delta T}\right]dx + \int_b^c E(x)E^*(x)\left[\frac{\Delta n_{SiO_2}}{\Delta T}\right]dx \quad (1)$$

where a is the position of the boundary between the waveguide layer and the lower cladding layer, b is the position of the boundary between the waveguide layer and the upper cladding layer, c and d are the limits of the cladding layers, $\Delta n_{SiO_2}/\Delta T$ is the change in the refractive index per ° C. of the $SiO_2$ in the cladding layers (which may differ from $\Delta n_{SiO_2}/\Delta T$ for bulk $SiO_2$) and $\Delta n_{Ta_2O_5}/\Delta T$ is the variation of the index per ° C. of the $Ta_2O_5$ in the waveguide layer. By choosing material such as $Ta_2O_5$ and $SiO_2$ which have Coefficients of Thermal Dispersion (CTD)$\equiv \Delta n/\Delta T$ of nearly equal magnitude but opposite sign ($\Delta n/\Delta T$ SiO$_2 \sim 1 \times 10^{-5}/°$ C., Ta$_2$O$_5 \sim -1.2 \times 10^{-5}/°$ C.) the $\Delta n_{eff}/\Delta T$ of equation (1) can be reduced well below the CTD of either SiO$_2$ or Ta$_2$O$_5$. If a material with a relatively large CTD is used in one of the layers (possibly required for a particular device structure or unique physical property) then it would tend to weight the waveguide CTD ($\Delta n_{eff}/\Delta T$) very heavily towards its own CTD. By choosing the thickness of each layer correctly, this effect can be counterbalanced as seen from equation (1). It may in some cases turn out that such an approach does not yield reproducible results because slight fabrication errors in the waveguide thickness will result in more or less of the mode amplitude propagating in the waveguide or cladding layers than was desired. In such a case a reduced sensitivity to the waveguide dimensions could be achieved by forming the layers of composite materials, e.g., (SiO$_2$)$_y$ (Ta$_2$O$_5$)$_{1-y}$ where the properties of the material are weighted in proportion to the variable y. By choosing y so that the material of each layer is compensated for a near zero CTD, then errors in thickness for each layer would be of much less significance, as can be seen from equation (1).

Thermally stabilized DBR lasers were described by S. A. Gurevich, et al, Sov. Tech. Phys. Lett. 11 (5), May, 1985 and by Zh. I. Alferov, et al, IIEEE Journal of Quantum Electronics, Vol. QE-23, No. 6, June, 1987. The lasers described incorporated a corrugated waveguide consisting of multiple dielectric layers, each layer with approximately equal and opposite changes in refractive index with temperature. The effect intended is that there is no change in refractive index with temperature, thus, no resulting change in wavelength according to the equation applicable to all DFB and DBR lasers $\lambda = 2n_{eff}\Lambda$, where $\lambda$=lazing wavelength, $n_{eff}$=effective refractive index of the waveguide, and $\Lambda$=corrugated grating spacing. (See, for example, Chapter 19 of "Quantum Electronics," 2nd ed., A. Yariv, Wiley, N.Y., 1975).

These monolithic temperature stabilized lasers suffer the disadvantage, however, that processing required to form the waveguide on a single substrate degrades the reliability of the laser facet. After formation of the active layer, the waveguide is formed by selective chemical etching and "micro-cleaving" of the layers, followed by deposition of the dielectric layers. Exposure of the active area to chemical etching compromises the laser's reliability due to cusping or undercut of the laser active area. It is also not clear that the long term reliability of facets formed by the "micro-cleaving" process is as good as those formed by conventional cleaving. These lasers are capable of maintaining a stable wavelength within a 5 Å band, which is still severely limiting for wavelength multiplexing when the useful a laser band is only 200 to 300 Å. In addition, because of different coefficients of expansion for the semiconductor substrate and the deposited dielectric, there is a risk of the dielectric peeling off the substrate.

It is desirable, then, to create a semiconductor diode laser which is temperature stabilized by use of corrugated dielectric waveguides capable of wavelength stability within 1 Å, which is not subject to degradation caused by the processing necessary to create the waveguides on the same substrate. It is to this end that the present invention is directed.

SUMMARY OF THE INVENTION

The present invention proposes a dielectric waveguide which is assembled with a commercially available diode laser to create a temperature stabilized laser. The waveguide comprises multiple dielectric films which have equal and opposite temperature induced changes in refractive index with respect to each other into which is formed a Bragg grating, the grooves of which are sufficiently shallow to allow penetration of light into the waveguide of 1 mm to 1 cm. This is the kay to narrowing the laser's spectrum down to about 1 Å width. The dielectric layers may be deposited using ion assisted deposition (IAD) and ion beam sputtering to provide uniform, high density films with reduced index-temperature coefficients and increased density, resulting in a waveguide with near-zero temperature variation in refractive index. After fabrication the waveguide is assembled to the diode laser, creating a temperature stabilized laser.

A device for temperature stabilizing the output wavelength of a diode laser comprises a substrate which is a laminar body of ultra-low thermal expansion glass, and a waveguide made of a plurality of dielectric layers deposited on the substrate. Each of the dielectric layers is deposited by ion assisted deposition in which the layer is bombarded with ions as it is deposited so as to achieve a more dense and amorphous film. A Bragg grating, comprising a corrugated region, is etched into a first layer of the dielectric material, the first layer of dielectric material having a thickness and refractive index. The notches of the corrugated region are etched to a depth such that the laser light entering the waveguide will penetrate at least 1 mm into the waveguide. A second layer of dielectric material abuts the first layer. The second layer exhibits a temperature dependent change in refractive index opposite to that of the first layer. The waveguide is disposed adjacent to one of the output mirrors of the diode laser in order to accomplish temperature stabilization of the output wavelength of the laser to within 1 Å of the target wavelength.

In an application of the temperature stabilized laser according to the present invention, a Nd:YAG laser may be pumped with constant absorption efficiency by using the present invention as a pump source.

DESCRIPTION OF THE PREFERRED EMBODIMENTS

Figure 1:
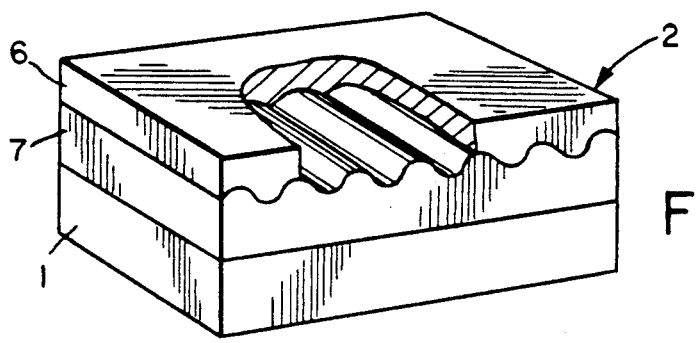
FIG. 1 is a perspective view of the waveguide with part of the waveguide cut away to reveal the Bragg grating notches.

The first embodiment of this invention is shown in FIG. 1 which is a perspective sectional view of the waveguide. Layer 1 is the substrate upon which all other layers are deposited. Layer 1 is an ultra-low thermal expansion glass, such as, but not limited to, Zerodur. Arrow 12 indicates the laser light path which will be used as a reference direction for later descriptions. All other identified layers in FIG. 1 are dielectric layers which are the heart of this invention.

Figure 2A:
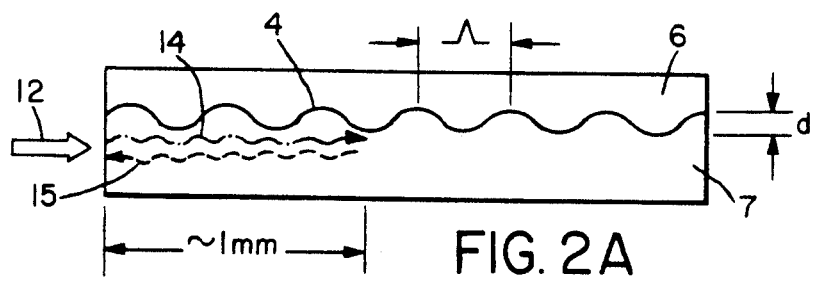
FIGS. 2A and 2B are two cross-sectional views of a Bragg grating waveguide, one showing the present invention, and the other showing the prior art.
Figure 2B:
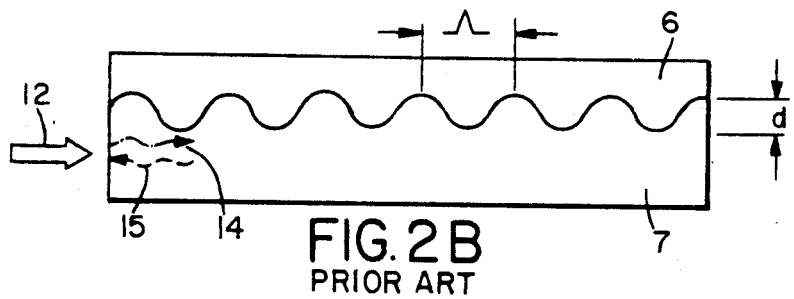

The present invention has a waveguide layer comprising dielectric layers of different refractive indices. The first dielectric layer 7 in FIG. 1 is $SiO_2$, which has a change in refractive index with temperature (hereafter called index-temperature coefficient) of approximately $1.0 \times 10^{-5}/°$ C. At the top of optical waveguide layer 7 is formed a periodic structure having a period or spacing $\Lambda$ and a depth d. The greater the depth d, the greater the effective refractive index perturbation from the widest point of the waveguide layer 6 to the thinnest part of layer 6, meaning that the refractive index perturbation can be tailored by the etched depth of the grating. The periodic structure which comprises the Bragg grating at the top of optical waveguide layer 7 is corrugated with the notches or ribs running perpendicular to the light path 12 and abutting one output mirror of the laser. A greater depth d will allow a wider band of wavelengths around the center wavelength to be reflected back into the laser. In order to narrow the band of wavelengths that are reflected, the grating depth should be relatively shallow. Since a deeper or stronger grating, shown in FIG. 2A, will reflect light traveling in the waveguide in a shorter distance, a weaker grating, shown in FIG. 2A, would provide a longer depth of penetration into the waveguide. The present invention describes a grating which is sufficiently shallow to permit incoming light 14 to penetrate approximately 1 mm to 1 cm into the waveguide. The resulting reflected light 15 will be within a tighter range of the desired wavelength than can be achieved with the prior art grating. The notches 4 are equidistant at spacing $\Lambda$ in order to satisfy the equation $\lambda_{peak} = 2 \Lambda n_{eff}$ for the wavelength desired for lazing. It is of limited value to stabilize the index of refraction against temperature drift to 1 Å or better, if the reflection peak is so wide that the laser has a spectral width greater than 1 Å. It is necessary to combine both narrow spectrum and a low drift spectrum to keep the wavelength i a narrow range. One of the differences between the work of Alferov et al., Gurevich et al. and the present work is that we optimize the strength of the Bragg grating to narrow its reflection peak and thus restrict the oscillation of wavelength around its average to as little as 1 Å. Prior workers made no attempt to accomplish this.

The second dielectric layer comprises a material which has an index-temperature coefficient which is approximately equal in magnitude but opposite to the index-temperature coefficient of $SiO_2$. Since the waveguiding is dependent upon the refractive index of the two layers within the waveguide, the present invention seeks to maintain the refractive index at a constant level, by canceling the changes in the refractive index in one layer with the changes in refractive index of the other layer. The suggested material for the second dielectric layer 6 is $Ta_2O_5$, however, other materials possessing the same index-temperature coefficient of approximately $-1.2°$ to $-1.4 \times 10^{-5}/°$ C. are acceptable and fall within the scope of this invention. In this case, the refractive index of $Ta_2O_5$ is higher than that of $SiO_2$, so the light will be confined primarily within the $Ta_2O_5$. Where the changes in index-temperature coefficient between dielectric layers 7 and 6 cannot be perfectly matched, the thickness d of layer 7 can be adjusted to compensate.

Both dielectric layers can be deposited using ion-assisted deposition (IAD). IAD involves the bombardment of the growing film with ions, so that the columns of atoms which normally form when depositing refractory oxides such as $SiO_2$ and $Ta_2O_5$ are broken down. The result is a more nearly amorphous film with high density, high refractive index and reduced tensile stress as compared with non IAD deposited films.

An additional means for compensation if a perfect match cannot be achieved is by codeposition of composite materials such as $(SiO_2)_x(Ta_2O_5)_{1-x}$ in order to raise or lower the index-temperature coefficient of one of the dielectric layers.

Figure 3:
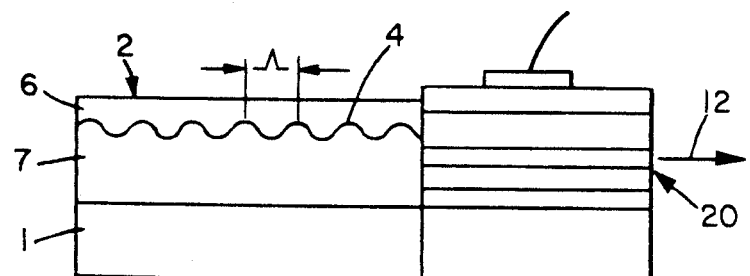
FIG. 3 is a cross-sectional view showing an the waveguide assembled to a diode laser.

The waveguide 2 is assembled to a commercially available laser 20, as shown in FIG. 3. An anti-reflective coating can also be deposited at the interface 25 of the laser and waveguide, so that minimal light loss occurs.

Figure 4:
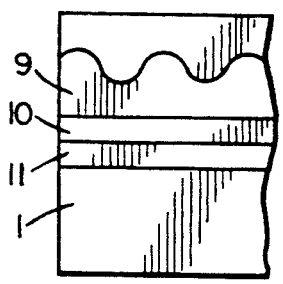
FIG. 4 is a partial cross-sectional view showing an alternate embodiment.

In an alternate embodiment, shown in FIG. 4, the first layer of dielectric 11 is $SiO_2$ and the second layer of dielectric 10 is a dielectric material with equal and opposite changes in index-temperature coefficient, such as $Ta_2O_5$, as suggested above. Overlying the second layer of dielectric 10 is a third dielectric layer 9, which is also $SiO_2$. The grating is located at the top of this third layer 9. The interfaces between layers 9 and 10 and between layers 10 and 11 serve as the refractive index discontinuities which are balanced by the equal and opposite index-temperature coefficients, but the periodic variation that acts as selective filter for certain wavelengths is placed at the third layer 9. By moving the grating farther upward in layer 9 it has less interaction with the wave trapped in layer 10. This allows a "weaker" grating to be formed without the need for very shallow gratings.

The present approach does not achieve line widths anywhere near as narrow as that of Blonder et al., but it has the advantage that it does not require any form of active cooling to avoid thermal drift of wavelength. The present device is oriented toward applications which can accept line widths on he order of 1 Å ($\sim 500$ Ghz), but must maintain this performance over wide temperature ranges without active cooling; high density WDM local area network, using AM (i.e. non-coherent) modulation and solid state laser pumping are good examples. The present invention allows the mode hops which Blonder et al. attempt to prevent, but the range of these mode hops is restricted to within a 1 Å band. This is the fundamental difference between the present approach and that of Blonder et al. this is accomplished by narrowing the spacing of longitudinal modes to about 0.1 Å so that many modes are present within the required 1 Å band. The approach of Blonder et al. attempts to isolate one of the longitudinal modes and eliminate all of the surrounding longitudinal modes. This requires much greater frequency selectivity than the present approach and leads to much greater sensitivity to environmental disturbances (e.g., temperature changes).

When the temperature varies, individual modes may drift and/or hop, but any which attempt to move outside the bragg grating envelope are suppressed.

Both of the described embodiments allow the fabrication of a waveguide by which a semiconductor diode can be stabilized against temperature-induced changes in output wavelength, providing the precise control necessary for wavelength-multiplexed communication systems.

Figure 5:
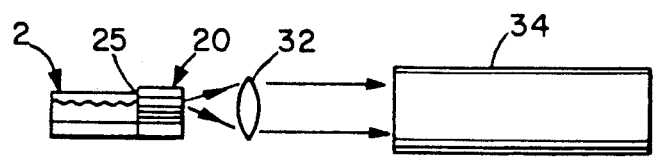
FIG. 5 is a schematic diagram of a Nd:YAG laser pumped by a temperature stabilized laser according to the present invention.

In a second embodiment, free-space optical communications may be accomplished by pumping a Nd:YAG or other solid state laser with a diode laser using the above-described means for temperature stabilization of the diode laser's wavelength. It is estimated that the overall efficiency of high power Nd:YAG lasers can be improved by a factor of two when the diode laser pump wavelength is stabilized to within a few. In FIG. 5, diode laser 20 is assembled with the waveguide 2 with anti-reflective coating 25 at the interface. The laser output 30 is focused by lens 32 into the end of the Nd:YAG crystal 34, and absorbed due to one of the atomic transitions of the Nd ion. The absorption coefficient of the Nd:YAG crystal is a strong function of the wavelength of the pump source, meaning that the Nd:YAG laser output will fluctuate as the source wavelength varies. This absorption bend is 5 Å wide. The use of a diode laser which has its wavelength restricted to approximately 1 Å over wide temperature ranges will allow stable Nd:YAG output to be obtained under widely varying environmental conditions.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A device for temperature stabilizing the output wavelength of a diode laser which comprises:
    a substrate comprising a laminar body of ultra-low thermal expansion glass; and
    a waveguide comprising a plurality of dielectric layers, each said dielectric layer deposited on said substrate by ion-assisted deposition wherein the layer is bombarded with ions as it is deposited, said plurality of dielectric layers having a first layer of dielectric material, said first layer having a thickness and refractive index, and a second layer of dielectric material overlying said first layer, said second layer which exhibits a temperature dependent change in refractive index opposite to that of said first layer, and a Bragg grating which comprises a corrugated region etched into one of said plurality of dielectric layers with notches of said corrugated region etched to a depth such that laser light entering said waveguide will penetrate approximately 1 mm to 1 cm therein, said waveguide being formed to be disposed adjacent to one of two output mirrors of said diode laser in order to accomplish temperature stabilization of said output wavelength of said laser to within 1 Å of the target wavelength over the temperature range from 20° C. to 70° C.

2. A device as in claim 1 wherein the thickness of said first layer is chosen such that its coefficient of thermal dispersion is opposite to the coefficient of thermal dispersion of said second layer.

3. A device as in claim 1 wherein said first layer of dielectric material is $SiO_2$ and has a refractive index wherein the coefficient of thermal dispersion is within the range of $1.0 \times 10^{-5}/°$ C. to $1.5 \times 10^{-5}/°$ C.

4. A device as in claim 1 wherein said second layer of dielectric material has a coefficient of thermal dispersion in the range of $-1.0 \times 10^{-5}/°$ C. to $-1.5 \times 10^{-5}/°$ C.

5. A device as in claim 1 wherein said second layer is $Ta_2O_5$.

6. A device as in claim 1 wherein ion assisted deposition comprises ion beam sputtering.

7. A device as in claim 1 wherein said Bragg grating is disposed at the interface between said first layer and said second layer.

8. A device as in claim 1 wherein said Bragg grating is disposed on a top surface of said second layer.

9. A device as in claim 8 wherein a third layer of dielectric material having a refractive index the same as that of said first layer overlies said second layer with said Bragg grating disposed at said interface between said second layer and said third layer.

10. A device for temperature stabilizing the output wavelength of a diode laser which comprises:
    a substrate of comprising a laminar body of ultra-low thermal expansion glass; and
    a waveguide comprising at least one dielectric layer and a Bragg grating, said layer deposited on said substrate by ion-assisted deposition wherein said layer is bombarded with ions as it is deposited, said layer having a thickness and refractive index, and said Bragg grating which comprises a corrugated region etched into one said layer of dielectric material, with notches of said corrugated region etched to a depth such that laser light entering said waveguide will penetrate approximately 1 mm to 1 cm therein, said waveguide formed to be disposed adjacent to one of two output mirrors of said diode laser in order to accomplish temperature stabilization of said output wavelength of said laser to within 1 Å of the target wavelength over a range of temperature from 20° C. to 70° C.

11. A device as in claim 10 wherein said layer comprises a codeposited film of a plurality of dielectric materials having opposite coefficients of thermal dispersion, one of said plurality of dielectric materials being $SiO_2$.

12. A device as in claim 10 wherein said dielectric layer comprises a composite of $(SiO_2)_x(Ta_2O_5)_{1-x}$.

13. A method of temperature stabilizing the output wavelength of a diode laser which comprises:
    depositing a waveguide comprising a plurality of dielectric layers and having a first layer with a thickness and refractive index using ion-assisted deposition onto at least a portion of a substrate of ultra-low thermal expansion glass;
    depositing a second layer of said plurality of dielectric materials over said first layer, said second layer exhibiting a temperature dependent change in refractive index opposite to that of said first layer;
    forming a Bragg grating in one of said plurality of dielectric layers said waveguide comprising a corrugated region with notches of said corrugated region etched to a depth such that laser light entering said waveguide will penetrate approximately 1 mm to 1 cm; and
    assembling said waveguide adjacent to one of two output mirrors of said diode laser with said notches parallel to said output mirror.

14. A method as in claim 13 wherein the step of depositing a waveguide includes selecting the thickness of said first layer to be such that its coefficient of thermal dispersion is opposite to the coefficient of thermal dispersion of said second layer.

15. A method as in claim 13 wherein the step of depositing a waveguide includes selecting said first layer of dielectric material to be $SiO_2$ with a refractive index wherein the coefficient of thermal dispersion is within the range of $1.0 \times 10^{-5}/°$ C. to $1.5 \times 10^{-5}/°$ C.

16. A method as in claim 13 wherein the step of depositing a waveguide includes selecting said second layer of dielectric material to have a coefficient of thermal dispersion in the range of $-1.0 \times 10^{-5}/°$ C. to $-1.5 \times 10^{-5}/°$ C.

17. A method as in claim 13 wherein the step of depositing a waveguide includes selecting said second layer to be $Ta_2O_5$.

18. A method as in claim 13 wherein the step of forming said Bragg grating comprises disposing said Bragg grating at the interface between said first layer and said second layer.

19. A method as in claim 13 wherein the step of forming said Bragg grating comprises disposing said Bragg grating on top of said second layer.

20. A method of fabricating a device as in claim 13 wherein the step of depositing said waveguide further comprises depositing a third layer of dielectric material having a refractive index the same as that of said first layer overlying said second layer with said Bragg grating disposed at an interface between said second layer and said third layer.

21. A method of temperature stabilizing the output wavelength of a diode laser which comprises:
    depositing a waveguide comprising a dielectric layer using ion-assisted deposition onto at least a portion of a substrate of ultra-low thermal expansion glass;
    forming a Bragg grating in said waveguide comprising a corrugated region with notches formed in said dielectric layer which has a thickness and a refractive index, with notches of said corrugated region etched to a depth such that laser light entering said waveguide will penetrate approximately 1 mm to 1 cm; and
    assembling said waveguide adjacent to one of two output mirrors of said diode laser, wherein said notches are parallel to said output mirror.

22. A method as in claim 21 wherein the step of depositing a waveguide includes selecting said dielectric layer to be codeposited using a plurality of dielectric materials which have opposite coefficients of thermal dispersion, one of said plurality of dielectric materials being $SiO_2$.

23. A method as in claim 21 wherein the step of depositing a waveguide includes selecting a codeposition of a plurality of dielectric materials to form a composite of $(SiO_2)_x(Ta_2O_5)_{1-x}$.

24. A method of producing an intensity stabilized signal for free-space optical communications comprising:
    depositing a waveguide comprising a plurality of dielectric layers using ion-assisted deposition onto at least a portion of a substrate of ultra-low thermal expansion glass each layer of said plurality having a thickness and a refractive index, and any two adjacent layers of said plurality having opposite changes in refractive index with temperature;
    forming a Bragg grating in said waveguide comprising a corrugated region with notches formed on a top surface of one of said plurality of dielectric layers, said notches of said corrugated region etched to a depth such that laser light entering said waveguide will penetrate approximately 1 mm to 1 cm;
    assembling said waveguide adjacent to one of two output mirrors of said diode laser with said notches parallel to said output mirror;
    disposing at least one solid state laser having an input end in the optical path of the output of said diode laser; and
    disposing a focusing means between said diode laser and each said solid state laser, the focal point of said focusing means being the input end of said solid state laser.

25. A method of producing an intensity stabilized signal for free-space optical communications as in claim 24 wherein the step of disposing said at least one solid state laser includes selecting at least one neodymium-:YAG laser.

26. A device as in claim 9 wherein said Bragg grating is disposed on a top surface of said third layer.

27. A method of fabricating a device as in claim 13 wherein the step of forming said waveguide further comprises depositing a third layer of dielectric material having a refractive index the same as that of said first layer overlying said second layer with said Bragg grating disposed at a top of said third layer.

* * * * *

UNITED STATES PATENT AND TRADEMARK OFFICE
CERTIFICATE OF CORRECTION

PATENT NO. : 5,043,991
DATED : August 27, 1991
INVENTOR(S) : Eric M. Bradley

It is certified that error appears in the above-indentified patent and that said Letters Patent is hereby corrected as shown below:

Col. 10, line 36, ":YAG laser" should read --:YAG (yttrium aluminum garnet) laser--.

Signed and Sealed this

Fourth Day of January, 1994

Attest:

BRUCE LEHMAN

*Attesting Officer*   Commissioner of Patents and Trademarks